United States Patent [19]

Miyazawa

[11] Patent Number: 5,277,601
[45] Date of Patent: Jan. 11, 1994

[54] HEADER COVER

[75] Inventor: Junichi Miyazawa, Yokohama, Japan

[73] Assignee: Molex Incorporated, Lisle, Ill.

[21] Appl. No.: 982,210

[22] Filed: Nov. 25, 1992

[30] Foreign Application Priority Data

Dec. 9, 1991 [JP] Japan .................. 3-109220[U]

[51] Int. Cl.5 .................................. H01R 13/44
[52] U.S. Cl. ........................... 439/135; 439/83; 439/476
[58] Field of Search ................ 439/68, 70, 71, 72, 439/73, 78, 83, 135, 136, 149, 476

[56] References Cited

U.S. PATENT DOCUMENTS

| 4,795,354 | 1/1989 | Owen | 439/135 X |
| 4,919,326 | 4/1989 | Stannek | 29/837 |
| 5,022,862 | 6/1991 | Martin et al. | 439/83 |
| 5,026,295 | 6/1991 | Fong et al. | 439/135 |
| 5,055,971 | 10/1991 | Fudala et al. | 361/400 |
| 5,147,209 | 9/1992 | Litwin et al. | 439/71 X |

OTHER PUBLICATIONS

SAMTEC'S Surface Mount Interconnect Handbook, pp. 19 and 20, Copyright 1992.

Primary Examiner—Larry I. Schwartz
Assistant Examiner—Khiem Nguyen
Attorney, Agent, or Firm—Charles S. Cohen

[57] ABSTRACT

Disclosed is a cover for use in automatically mounting electric connectors to a printed-circuit board with the aid of a vacuum-suction nozzle. The cover comprises a top plate to which the vacuum-suction nozzle can be applied, and opposite hooks integrally connected to the opposite ends of the top plate which catch the opposite side walls of the connector housing. The fitting cover may be easily attached to an electric connector having pin-like terminals projecting from its upper surface to cover the pin-like terminals of the electric connector. The attaching of the fitting cover to the electric connector will provide a smooth, flat surface to the connector-and-cover combination, thereby facilitating the use of the vacuum suction nozzle to hold electrical connectors regardless of the contour of their upper surface.

17 Claims, 5 Drawing Sheets

HEADER COVER

FIELD OF THE INVENTION

The present invention relates to a cover for use in automatically mounting electric connectors to the surface of a printed-circuit board with the aid of a vacuum-suction nozzle and more particularly, to a cover for securing to an electric connector comprising a housing and pin-like terminals projecting from the upper surface of the housing.

BACKGROUND OF THE INVENTION

As is well known, a soldering reflow vessel is often used in automatically mounting electric connectors to printed-circuit boards. Specifically, an electric connector is secured by a vacuum-suction nozzle, and the electric connector is adjusted in position and brought to a selected position in a printed-circuit board by the vacuum-suction nozzle. The electric connector is then released from the vacuum-suction nozzle by stopping application of negative pressure thereto. Then, gas is released inside the soldering reflow vessel, or infrared rays are radiated therein until the solder applied to selected conductors in the printed-circuit board has been melted, thereby soldering the solder tails of the electric connector to the selected conductors in the printed-circuit board.

As for the electric connector, if it has a flat top surface, such top surface is convenient for securement by a vacuum-suction nozzle as described above. Many electric connectors, however, have pin-like terminals projecting from their top surface, thus preventing the direct use of vacuum-suction nozzles.

SUMMARY OF THE INVENTION

One object of the present invention is to provide a cover for use in automatically mounting electric connectors to the surface of a printed-circuit board with the aid of a vacuum-suction nozzle regardless of the configuration of the top surface of the electric connectors.

To attain this object, a fitting cover according to the present invention comprises a top plate to which the end of a vacuum-suction nozzle can be applied, and opposite hooks integrally connected to the opposite ends of said top plate. These hooks catch the opposite side walls of the connector housing. The attaching of the fitting cover to the electric connector provides a smooth, flat surface to the electric connector convenient to the suctioning-and holding of the electric connector by a vacuum-suction nozzle, regardless of irregular contours on the top surface of the electric connector. Thus, existing vacuum-suction nozzles can be used to hold different electric connectors without modification.

According to one aspect of the present invention, a fitting cover may have hooks with an engagement projection integrally connected thereto to fit in the engagement recess of each of the opposite side walls of the connector housing. This arrangement facilitates the reliable holding and release of electric connectors from their associated covers.

According to another aspect of the present invention, the rear side of the top plate of the fitting cover is designed to be brought in contact with the tips of the pin-like terminal of the electric connector when the engagement projection of each hook of the cover fits in the engagement recess of each of the opposite side walls of the connector housing. The pin-like terminals of equal height are pushed against the lower side of the top plate of the fitting cover, thereby permitting the electric connector to be held in horizontal position, perpendicular to the longitudinal axis of the vacuum suction nozzle. This facilitates controlling the position of the electric connector handled by the vacuum suction nozzle. The pressure caused by the vacuum suction nozzle is distributed equally to all pin-like terminals, and therefore, there is no fear of deformation of selected pin-like terminals, which may be caused in case of pin-like terminals of unequal heights.

According to still another aspect of the present invention, the width 1 of the top plate of the dover is selected to be smaller than the tip-to-tip lateral distance L of opposite solder tails of the electric connector. This arrangement permits the complete exposure of all solder tails of the electric connector to infrared rays for soldering without being concealed behind the fitted cover.

Other objects and advantages of the present invention will be apparent from the following description of a fitting cover according to a preferred embodiment of the present invention, which is shown in accompanying drawings:

DETAILED DESCRIPTION OF THE PREFERRED EMBODIMENT

Figure 1:
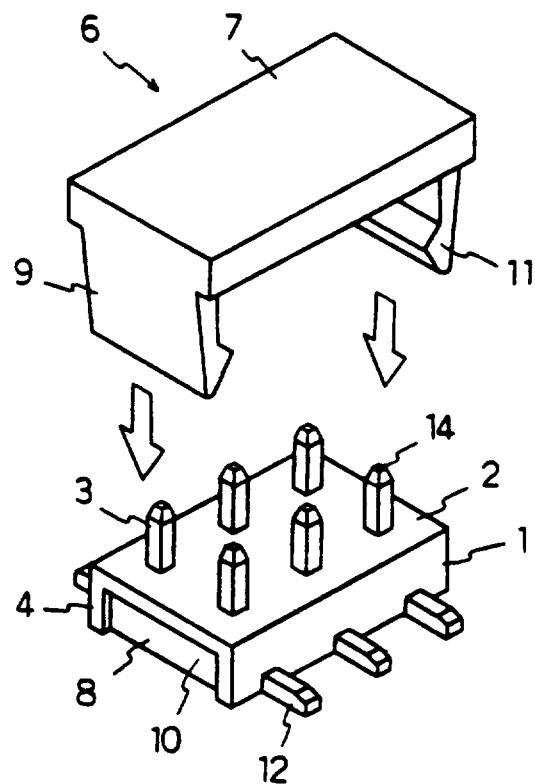
FIG. 1 is a perspective view of an electric connector and fitting cover according to the present invention prior to attaching of the fitting cover to the electric connector.

As seen from drawings and in particular FIG. 1, an electric connector 4 comprises a housing 1 and pin-like terminals 3 project from the upper surface 2 of the housing 1. The electric connector 4 is to be mounted to a printed-circuit board (not shown) with the aid of a vacuum-suction nozzle 5. A cover 6 is used in automatically mounting such electric connector 4 to the printed-circuit board. The cover comprises a top plate 7, to which the end 16 of a vacuum-suction nozzle 5 can be applied, and opposite arms 9 integrally connected to the opposite ends of the top plate 7 which latch the opposite side walls 8 of the connector housing 1. Each arm 9 has an engagement projection or hook 11 to fit in the engagement recess 10 of each side wall 8 of the connector housing 1 in order to latch the cover 6 to connector 4.

Figure 2:
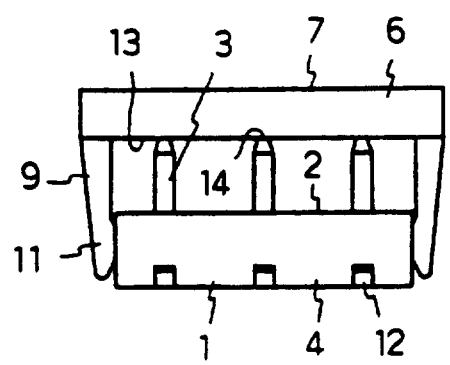
FIG. 2 is a front view of the integral combination of the electric connector and the fitting cover.

As best seen from FIG. 2, the underside 13 of the top plate 7 of the fitting cover 6 is designed to be brought into contact with the tips 14 of the pin-like terminals 3 of the electric connector 4 when the cover 6 is positioned on connector 4 and engagement projection 11 fits in the engagement recess 10 of each of the opposite side walls 8 of the connector housing 1.

Figure 3:
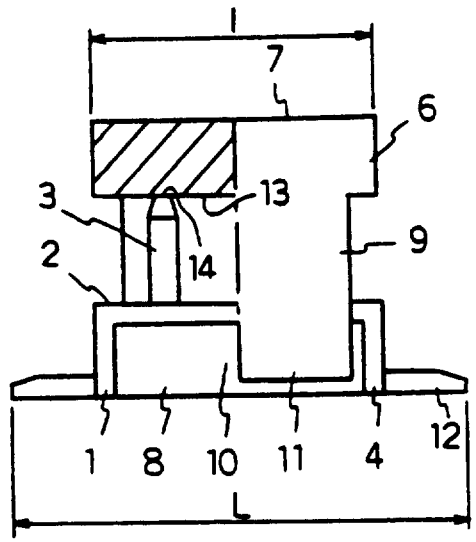
FIG. 3 is a side view, partly in section, of the integral combination of the electric connector and the fitting cover.
Figure 4:
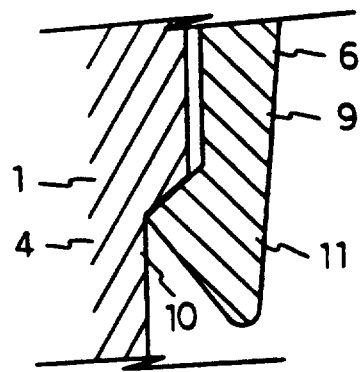
FIG. 4 is an enlarged view, showing how the fitting cover is engaged with the electric connector.
Figure 5:
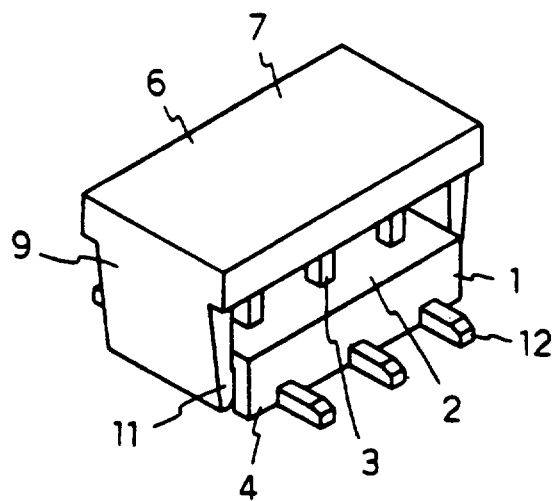
FIG. 5 is a perspective view of the integral combination of the electric connector and the fitting cover.
Figure 6:
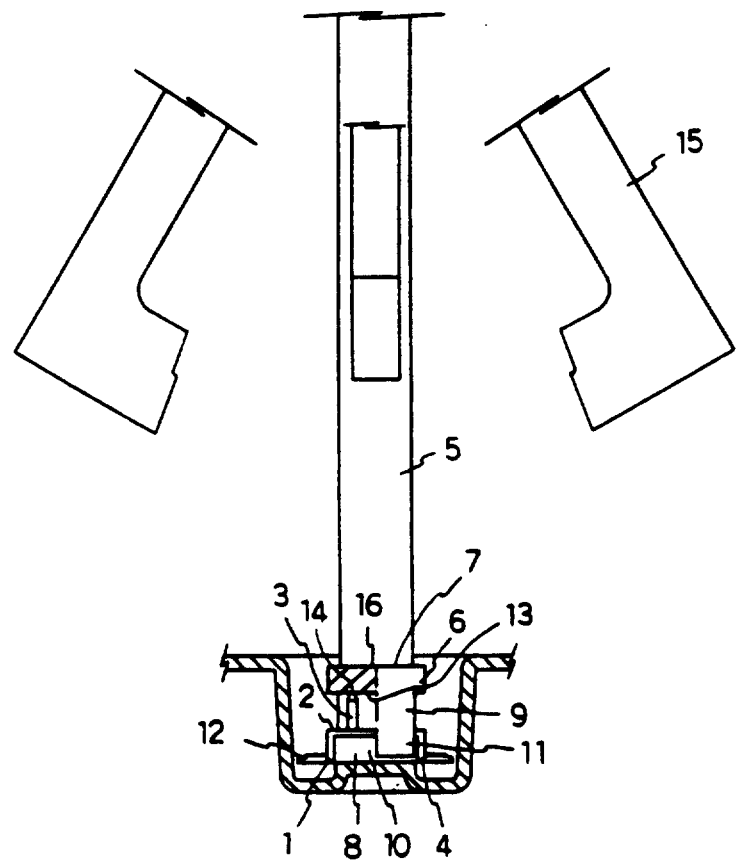
FIG. 6 shows the manner in which a vacuum-suction nozzle is initially suctioning and holding an electric connector while in packaging utilized for shipping of the connector.

As best seen from FIG. 3, the width or lateral dimension 1 of the ceiling plate 7 of the cover 6 is selected to be smaller than the tip-to-tip lateral distance L of opposite solder tails 12 of the electric connector 4.

In use, the cover 6 is fitted on the electric connector 4 with the underside of the cover 6 pushed against the pin-like projections 14 of the electric connector 4 and with the opposite hooks 9 of the cover 6 caught by the recesses 10 of the opposite sides of the electric connector 4. A printed-circuit board on which the electric connector is to be placed will be parallel to the top surface of the cover 6, which is fitted on the electric connector 4 as just described. As described earlier, the width or lateral dimension 1 of the top plate of the cover is smaller than the tip-to-tip lateral distance L of opposite solder tails 12 of the electric connector 4.

Figure 7:
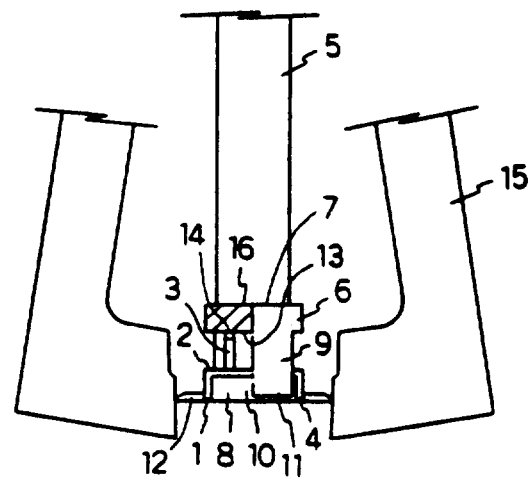
FIG. 7 shows the manner in which the electric connector having an associated fitting cover attached thereto is aligned in lateral position by a pair of opposite positioning arms.
Figure 8:
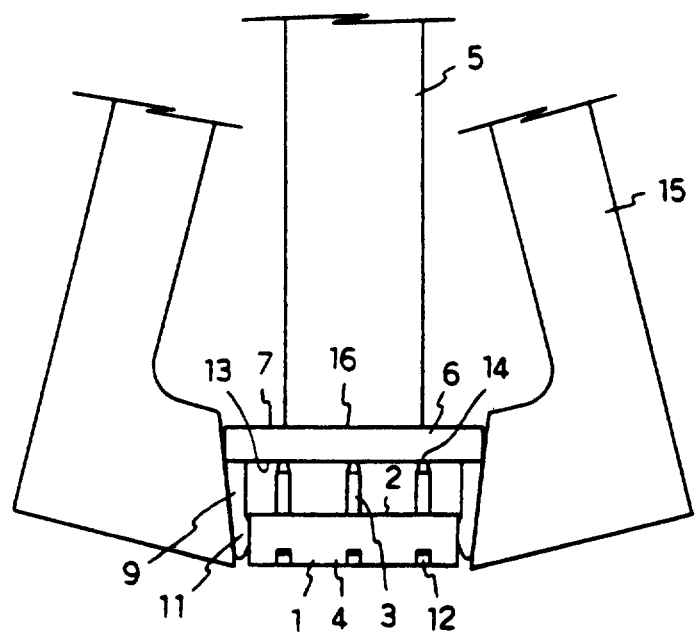
FIG. 8 shows the manner in which the electric connector and fitting cover combination is aligned in longitudinal position by another pair of opposite positioning arms.

An integral combination of electric connector and cover is attracted to the vacuum suction nozzle 5 by applying negative pressure to the cover 6. Specifically, the end 16 of the vacuum nozzle 5 is put in contact with the top plate 7 of the cover 6 and negative pressure is applied to the ceiling plate 7 of the cover 6, thereby causing the connector and cover combination to be held by the vacuum suction nozzle 5. Then, as seen from FIGS. 7 and 8, the connector-and-cover combination is adjusted in position to reduce lateral and longitudinal deviations, if any, relative to the center of the connector 4 with the aid of two pairs of positioning arms 15.

The connector and cover combination is brought to a selected position on the printed-circuit board where the electric connector 4 is placed. Then, application of negative pressure to the top 7 of the cover 6 is stopped, thereby releasing the connector.

The printed-circuit board having the electric connector 4 placed thereon is brought to a reflow vessel in which, for instance, infrared rays are radiated to melt the solder applied to selected conductors of the printed-circuit board. Gas may be used in place of infrared rays for soldering in the reflow vessel. Thus, the solder tails 12 of the electric connector 4 are soldered to the selected conductors of the printed-circuit board. After attaching the electric connector 4 to the printed circuit board, the cover 6 is removed from the electric connector 4.

As may be understood from the above, a fitting cover may be easily attached to an electric connector having pin-like terminals projecting from its upper surface with its opposite hooks caught in the recesses of the opposite sides of the electric connector, thus covering the pin-like terminals of the electric connector. The attaching of the fitting cover to the electric connector will provide a smooth, flat surface to the connector and cover combination, thereby facilitating the use of a vacuum-suction nozzle to hold the electrical connector regardless of an irregular contour on the top surface of the electrical connector.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an electrical connector assembly for mounting to a mounting surface of an electrical apparatus through the engagement of a vacuum-suction nozzle, said assembly including a header having an insulative housing with a first lower-most surface adapted to be positioned adjacent said mounting surface, a second upper-most surface opposite said first surface, said upper-most surface defining the highest non-conductive portion of the header to be positioned above said mounting surface, and a pair of opposed, outwardly facing sidewalls generally perpendicular to said first surface, said header further including a plurality of conductive terminals mounted therein, each terminal having a tail portion for interconnecting to circuitry of the electrical apparatus and a free end extending upward beyond said second surface of the housing for mating with a complementary electrical component, and said free end being positioned above said upper-most surface of said housing, wherein the improvement comprises:

a cover positioned on said header to overlie a central region of said housing, said cover having a generally planar, smooth top surface for engagement by the vacuum-suction nozzle and a pair of spaced apart, cantilevered arms depending downward for engaging said outwardly facing sidewalls of said housing; and complementary releasable retention means on said sidewalls of the housing an inwardly facing portions of said cantilevered arms for releasably securing said cover to said header.

2. The electrical connector assembly of claim 1 each said cantilevered arm includes a hook adjacent an end thereof with an engagement projection extending therefrom that fits into an engagement recess in one of said sidewalls to releasably secure said cover to said header.

3. The electrical connector assembly of claim 1 wherein said cover has a lower surface facing said second surface of the housing, and said housing, said terminals, and said cover are dimensioned so that said lower surface of said cover engages the free ends of said terminals when said cover is secured to said header.

4. The electrical connector assembly of claim 2 wherein said cover has a lower surface facing said second surface of the housing, and said housing, said terminals, and said cover are dimensioned so that said lower surface of said cover engages the free ends of said terminals when said cover is secured to said header and said engagement projections extend into their respective engagement recesses.

5. The electrical connector assembly of claim 1 wherein the tail portions of said terminals are configured for mounting to the mounting surface, an end of each said tail portion extends beyond the perimeter of the housing, the header has a width in a first direction equal to the distance between the ends of aligned terminals positioned on opposite sides of said housing, and the width of the header in said first direction is greater than the width of said cover in said first direction.

6. The electrical connector assembly of claim 3 wherein the tail portions of said terminals are configured for mounting to the mounting surface, an end of each said tail portion extends beyond the perimeter of the housing, the header has a width in a first direction equal to the distance between the ends of aligned terminals positioned on opposite sides of said housing, and the width of the header in said first direction is greater than the width of said over in said first direction.

7. In a surface mount electrical connector assembly for mounting to a mounting surface of an electrical apparatus through the engagement of a vacuum-suction nozzle, said assembly including a first connector having an insulative housing with a first lower-most surface adapted to be positioned adjacent said mounting surface and a second upper-most surface opposite said first surface, said upper-most surface defining the highest non-conductive portion of the first connector to be positioned above said mounting surface, said first connector further including a plurality of conductive terminals mounted therein, each terminal having a surface mount tail portion for interconnection to circuitry on the surface of the electrical apparatus and an elevated end extending beyond said second surface of the housing, said elevated end being positioned above said upper-most surface of said housing, said housing extending only around a central region of said terminals between said tail portion and said elevated end, wherein the improvement comprises:

a cover positioned on said first connector to overlie a central region of said housing, said cover having a generally planar, smooth top surface for engagement by the vacuum-suction nozzle; and
complementary releasable retention means for releasably securing said cover to said first connector.

8. The electrical connector assembly of claim 7 wherein said complementary releasable retention means includes a pair of cantilevered arms having a hook adjacent an end of each said arm with an engagement projection extending therefrom that fits into an engagement recess in one of said sidewalls to releasably secure said cover to said first connector.

9. The electrical connector assembly of claim 7 wherein said cover has a lower surface facing said second surface of the housing, and said housing, said terminals, and said cover are dimensioned so that said lower surface of said cover engages the free ends of said terminals when said cover is secured to said first connector.

10. The electrical connector assembly of claim 8 wherein said cover has a lower surface facing said second surface of the housing, and said housing, said terminals, and said cover are dimensioned so that said lower surface of said cover engages the free ends of said terminals when said cover is secured to said first connector.

11. The electrical connector assembly of claim 7 wherein the tail portions of said terminals are configured for mounting to the mounting surface, an end of each said tail portion extends beyond the perimeter of the housing, the first connector has a width in a first direction equal to the distance between the ends of aligned terminals positioned on opposite sides of said housing, and the width of the first connector in said first direction is greater than the width of said cover in said first direction.

12. The electrical connector assembly of claim 9 wherein the tail portions of said terminals are configured for mounting to the mounting surface, an end of each said tail portion extends beyond the perimeter of the housing, the first connector has a width in a first direction equal to the distance between the ends of aligned terminals positioned on opposite sides of said housing, and the width of the first connector in said first direction is greater than the width of said cover in said first direction.

13. The electrical connector assembly of claim 7 wherein the tail portions of said terminals are configured for mounting to the mounting surface, an end of each said tail portion extends beyond the lateral edge of said cover.

14. The electrical connector of claim 1 wherein said housing extends only around a central region of said terminals located between said tail portions and said free ends thereof.

15. The electrical connector of claim 1 wherein each said cantilevered arm includes a hook adjacent an end thereof with an engagement projection extending therefrom that latchingly engages a portion of one of said sidewalls to releasably secure said cover to said header, said engagement projection being tapered away from said housing.

16. The electrical connector of claim 15 wherein said portion of said one of said sidewalls is complimentarily tapered in a manner generally identical to said tapered hook to provide sufficient friction to releasably secure the cover to said header.

17. The electrical connector of claim 7 wherein said cover includes a pair of cantilevered arms having a hook adjacent an end thereof with an engagement projection extending therefrom that latchingly engages a portion of one of said sidewalls to releasably secure said cover to said header, said engagement projection being tapered away from said housing and said portion of said one of said sidewalls is complimentarily tapered in a manner generally identical to said tapered hook to provide sufficient friction to releasably secure the cover to said header.

* * * * *